(12) United States Patent
Su et al.

(10) Patent No.: US 8,947,348 B2
(45) Date of Patent: Feb. 3, 2015

(54) PROXIMITY SENSOR SWITCH-CONTROLLED METER AND LAMP SWITCH SYSTEM

(76) Inventors: Kuo-Hsin Su, Hsintien (TW); I-Te Chang, Taipei (TW)

( * ) Notice: Subject to any disclaimer, the term of this patent is extended or adjusted under 35 U.S.C. 154(b) by 1129 days.

(21) Appl. No.: 12/320,144

(22) Filed: Jan. 21, 2009

(65) Prior Publication Data

US 2010/0001974 A1 Jan. 7, 2010

(30) Foreign Application Priority Data

Jul. 4, 2008 (TW) .............................. 97211945 U (51) Int. Cl.
| | | |
|---|---|---|
| G09G 5/00 | (2006.01) | |
| B60Q 1/00 | (2006.01) | |
| B60Q 1/14 | (2006.01) | |
| H03K 17/96 | (2006.01) | |

(52) U.S. Cl.
CPC ............ B60Q 1/0082 (2013.01); B60Q 1/1484 (2013.01); H03K 17/9622 (2013.01); H03K 2217/960755 (2013.01)
USPC .......................... 345/156; 340/425.5; 340/441

(58) Field of Classification Search
CPC .................................................... H03K 17/962
USPC .................... 345/173–174, 156–157; 180/90; 362/475; 200/600; 178/18.06; 296/70; 340/425.5–490
See application file for complete search history.

(56) References Cited

U.S. PATENT DOCUMENTS

| | | | | |
|---|---|---|---|---|
| 4,880,400 | A * | 11/1989 | Baubles ......................... | 439/722 |
| 5,281,760 | A * | 1/1994 | Kikuchi et al. ............. | 174/74 R |
| 6,265,682 | B1 * | 7/2001 | Lee ................................ | 200/600 |
| 6,396,394 | B1 * | 5/2002 | Suzuki et al. .............. | 340/425.5 |
| 6,621,471 | B1 * | 9/2003 | Ozaki et al. ........................ | 345/4 |
| 6,651,422 | B1 * | 11/2003 | LeGare ............................ | 60/277 |
| 6,966,663 | B2 * | 11/2005 | Wada et al. ..................... | 362/29 |
| 6,967,903 | B2 * | 11/2005 | Guanter ......................... | 368/224 |
| 7,113,077 | B2 * | 9/2006 | Masters et al. .............. | 340/425.5 |
| 7,295,904 | B2 * | 11/2007 | Kanevsky et al. .............. | 701/36 |
| 2002/0057020 | A1 * | 5/2002 | Caldwell ........................ | 307/112 |
| 2004/0013042 | A1 * | 1/2004 | Farine ............................ | 368/10 |
| 2004/0046713 | A1 * | 3/2004 | Tanaka et al. ................... | 345/33 |
| 2005/0109261 | A1 * | 5/2005 | Tanaka et al. ................. | 116/300 |
| 2006/0046532 | A1 * | 3/2006 | Hjort et al. ..................... | 439/74 |
| 2006/0238513 | A1 * | 10/2006 | Philipp ......................... | 345/173 |
| 2007/0100523 | A1 * | 5/2007 | Trachte .......................... | 701/41 |
| 2009/0091906 | A1 * | 4/2009 | Arione et al. ................. | 361/781 |
| 2009/0107829 | A1 * | 4/2009 | Heimann ...................... | 200/600 |
| 2009/0174682 | A1 * | 7/2009 | Bowden et al. .............. | 345/173 |

* cited by examiner

*Primary Examiner* — Matthew Fry
(74) *Attorney, Agent, or Firm* — Rosenberg, Klein & Lee (57) ABSTRACT

A proximity sensor switch-controlled meter and lamp switch system installed in a motor vehicle that can be a motorcycle or car is disclosed to include a meter having a micro-controller unit (MCU) and an electronic display device, a lamp switch unit installed in one handlebar (or the motorcycle) or steering wheel (of the car), and proximity sensor switches respectively mounted in the meter and the lamp switch unit for controlling the micro-controller unit (MCU) to control the display mode of an electronic display device of the meter or to switch on/off the headlamp or left/right turn signal light of the motor vehicle when the motorcycle rider or car driver touches the meter or the lamp switch unit with a finger.

9 Claims, 9 Drawing Sheets

PROXIMITY SENSOR SWITCH-CONTROLLED METER AND LAMP SWITCH SYSTEM

BACKGROUND OF THE INVENTION

1. Field of the Invention

The present invention relates to a display control of an electronic meter of a motor vehicle and on/off switching control of the headlamp and left/right turn signal lights of the motor vehicle and, more particularly, to a proximity sensor switch-controlled meter and lamp switch system for motor vehicle.

2. Description of the Related Art

Figure 13:
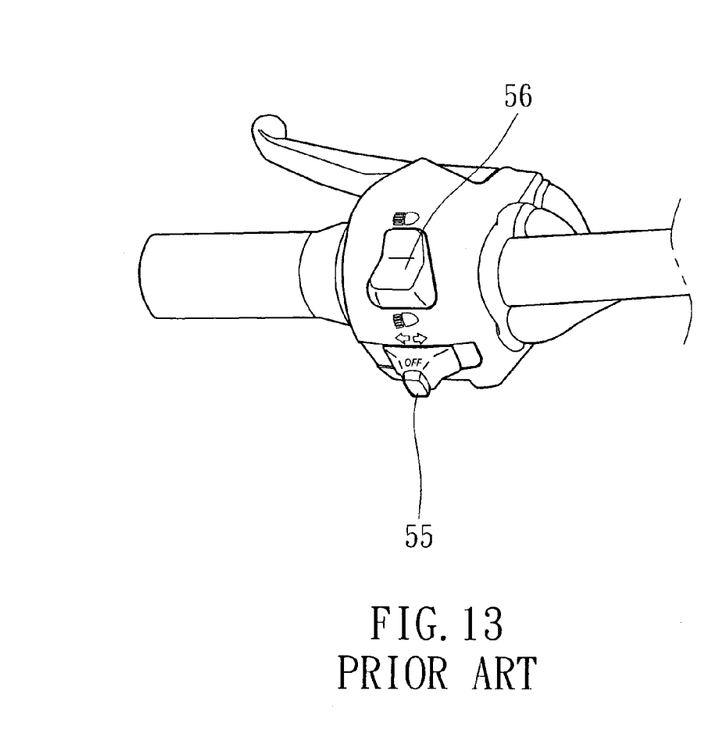
FIG. 13 illustrates a headlight control switch and a turn signal control switch mounted on one handlebar of a motorcycle according to the prior art.
Figure 14:
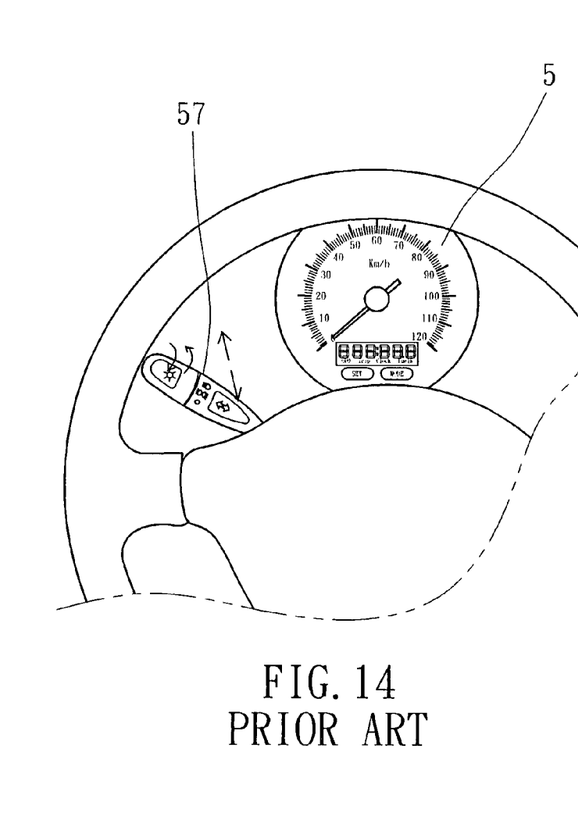
FIG. 14 illustrates a headlamp and turn signal light control switch assembly mounted on the steering wheel of a car according to the prior art.

A conventional vehicle electronic meter 5, as shown in FIGS. 9~12, comprises a circuit board 52 carrying a plurality of switches 522 and a microprocessor 523, a transparent glass 54 having a recessed portion 541 and a plurality of through holes 542 cut through the recessed portion 541, a combination of rubber key caps 51 mounted in the recessed portion 541 and packed with a packing frame 512, a faceplate 53 set between the transparent glass 54 and the circuit board 52 and having a plurality of through holes 531 in alignment between the through holes 542 of the transparent glass 54 and the switches 522, a plurality of spring members 513 respectively mounted on the circuit board 52 around the switches 522, and a plurality of links 511 respectively inserted through the through holes 542 of the transparent glass 54 and the through holes 531 of the faceplate 53 and supported on the spring members 513 and kept in contact between the combination of rubber key caps 51 and the switches 522. By means of operating the combination of rubber key caps 51 to force one link 511 against the associating switch 522, the microprocessor 523 is controlled to switch the display mode of the display device 521 that is electrically connected to the circuit board 52. Further, a motorcycle has a headlight control switch 55 and a turn signal control switch 56 mounted on one handlebar for switching on/off the headlight 561 or left/right turn signal light 551 (see FIG. 13). Further, a car has a headlamp and turn signal light control switch assembly 57 mounted on the steering wheel for switching on/off the headlight 561 and left/right turn signal light 551 (see FIG. 14).

The aforesaid meter and lamp switching arrangement has drawbacks as follows:

1. External moisture and dust may enter the inside of the electronic meter through the through holes on the transparent glass and the through holes on the faceplate to contaminate or wet the precision electronic components of the electronic meter when the combination of rubber key caps and the packing frame start to wear after a long use of the electronic meter, causing malfunctioning of the electronic meter.

2. Due to waterproof and dustproof considerations and reliability and operation convenience requirements, the system arrangement is complicated, resulting in a high cost.

SUMMARY OF THE INVENTION

It is one object of the present invention to provide a proximity sensor switch-controlled meter and lamp switch system for motor vehicle, which uses solid circuit means to control meter display mode and lamp on/off switching, avoiding friction between parts and assuring high durability and reliability.

It is another object of the present invention to provide a proximity sensor switch-controlled meter and lamp switch system for motor vehicle, which has a simple structure and excellent waterproof arrangement without destructing the transparent covering of the meter and, which facilitates operation.

To achieve these and other objects of the present invention, a proximity sensor switch-controlled meter and lamp switch system is used in a motor vehicle, comprising a meter, and at least one proximity sensor switch. The meter comprises a faceplate, a transparent glass covering the faceplate, a circuit board provided at the bottom side of the faceplate, the circuit board comprising a micro-controller unit, and an electronic display device mounted in the faceplate and electrically connected to the micro-controller unit. The at least one proximity sensor switch is mounted in the faceplate in close contact with the transparent glass and electrically connected to the micro-controller unit of the circuit board. When a user touches the transparent glass corresponding to one proximity sensor switch with a finger, the respective proximity sensor switch is induced to output a signal to the micro-controller unit, causing the micro-controller unit to switch the display mode of the electronic display device.

Further, a lamp switch unit is electrically connected to the micro-controller unit for switching on/off the headlamp and left/right turn signal lights of the motor vehicle by means of proximity sensor switches.

DETAILED DESCRIPTION OF THE PREFERRED EMBODIMENT

Referring to FIGS. 1~4, a proximity sensor switch-controlled meter and lamp switch system is used in a vehicle (car or motorcycle), comprising an electronic meter 1 and a lamp switch system controllable by a touch of a human finger 2 to switch the display information of the electronic meter 1 or to turn on/off the headlamp 127 and/or the left or right turn signal light 128. The electronic meter 1 comprises a faceplate 13, a transparent glass 14 covering the faceplate 13, a circuit board 12 disposed at the bottom side of the faceplate 13, and a plurality of proximity sensor switches 11 installed in the faceplate 13 and the circuit board 12 for setting and display mode control. Each proximity sensor switch 11 comprises an induction plate 111 mounted in the faceplate 13 and having a bottom conductor 1111, a conducting member, which can be a wire conductor, metal conducting column, non-metallic conducting member or printed circuit board and which, according to the present preferred embodiment is a conducting means 112 fastened to a respective via hole on the circuit board 12 with a respective nut 113 and kept in contact with the bottom conductor 1111 of the induction plate 111. The circuit board 12 comprises a display device 121 for information display, a micro-controller unit (MCU) 122 adapted to control the display device 121 in displaying total mileage, mileage, clock, and fuel volume and to turn on off the headlamp 127 and/or the left or right turn signal light 128 subject to the control of the proximity sensor switches 11 and the lamp switch system (this will be described further), and a plurality of capacitive proximity sensors 126 respectively electrically connected between the proximity sensor switches 11 and the micro-controller unit (MCU) 122.

Figure 1:
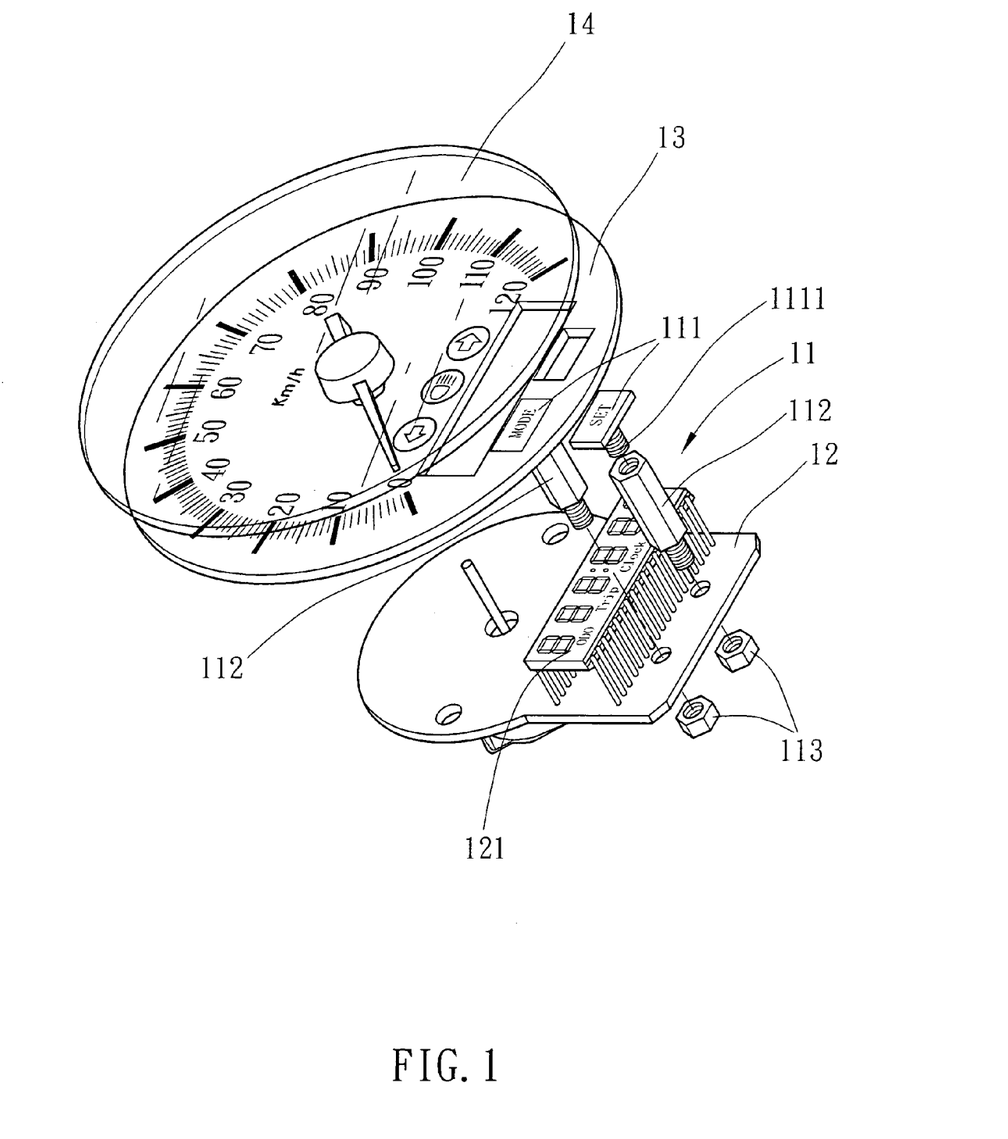
FIG. 1 is an exploded view of a meter of a proximity sensor switch-controlled meter and lamp switch system according to the present invention.
Figure 2:
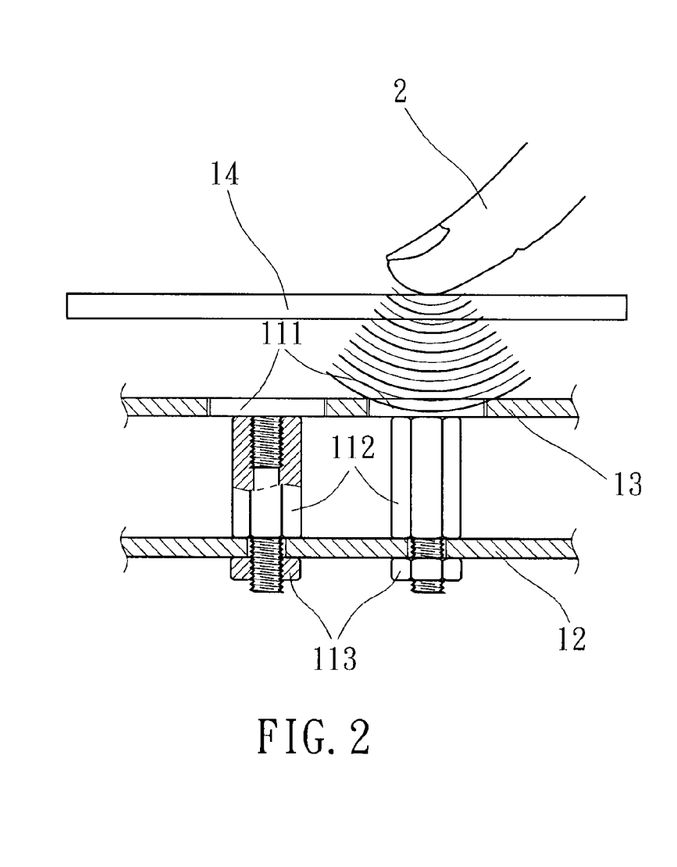
FIG. 2 is an elevational view of the meter according to the present invention.
Figure 3:
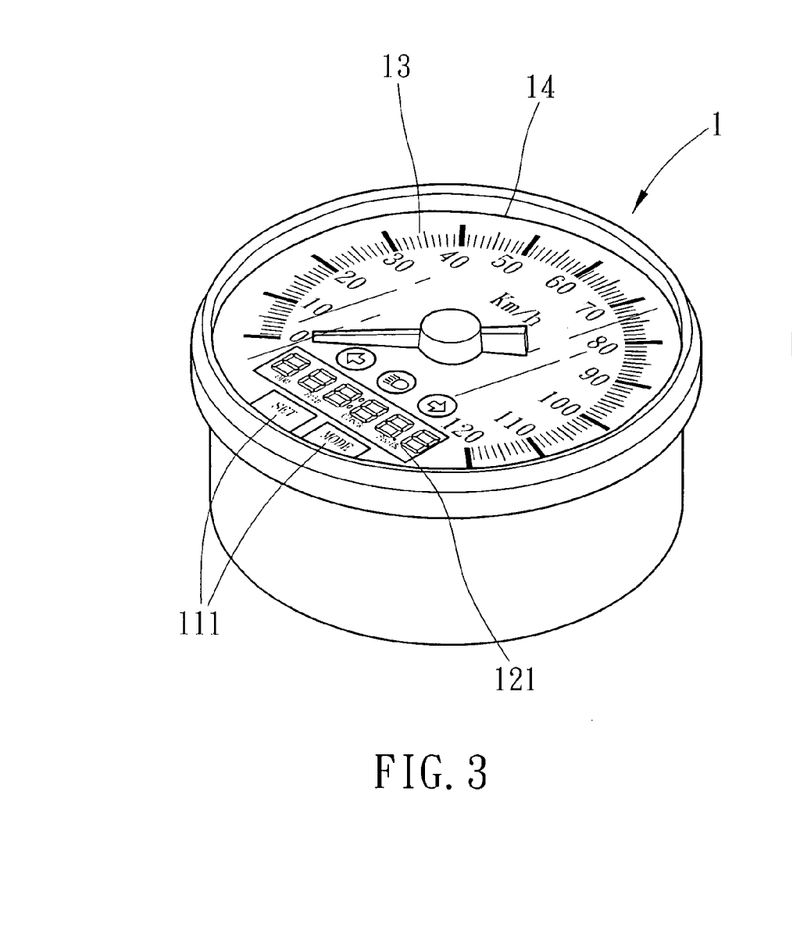
FIG. 3 is a schematic sectional view of a part of the present invention, showing a status of use of the meter.
Figure 4:
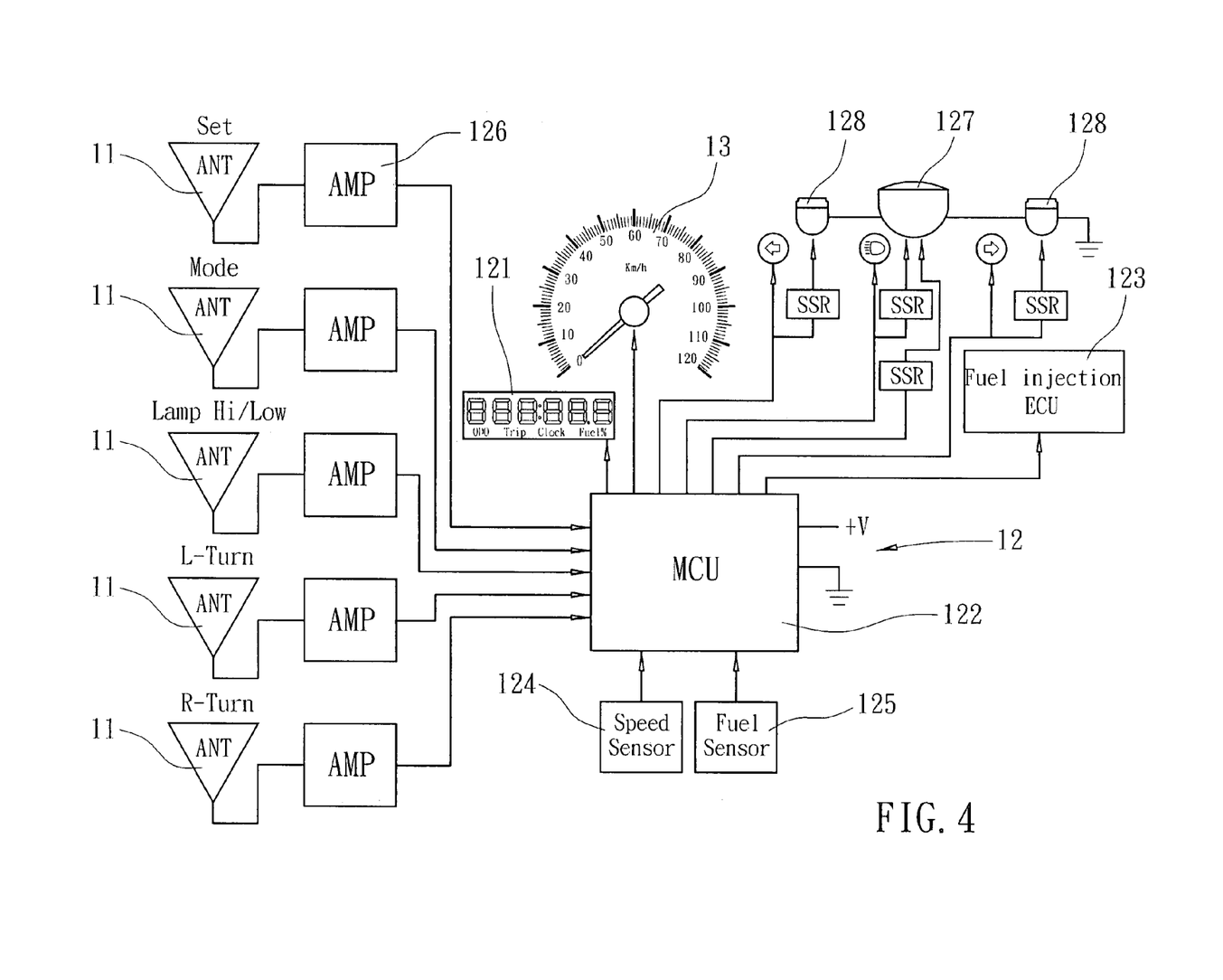
FIG. 4 is a system block diagram of the present invention.
Figure 5:
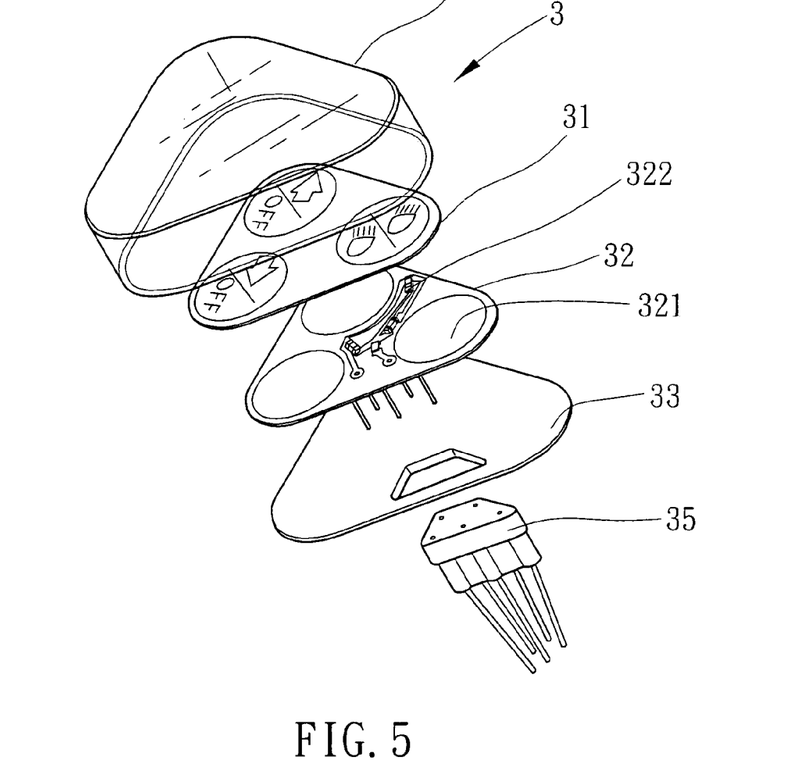
FIG. 5 is an exploded view of a lamp switch unit of the proximity sensor switch-controlled meter and lamp switch system according to the present invention.
Figure 6:
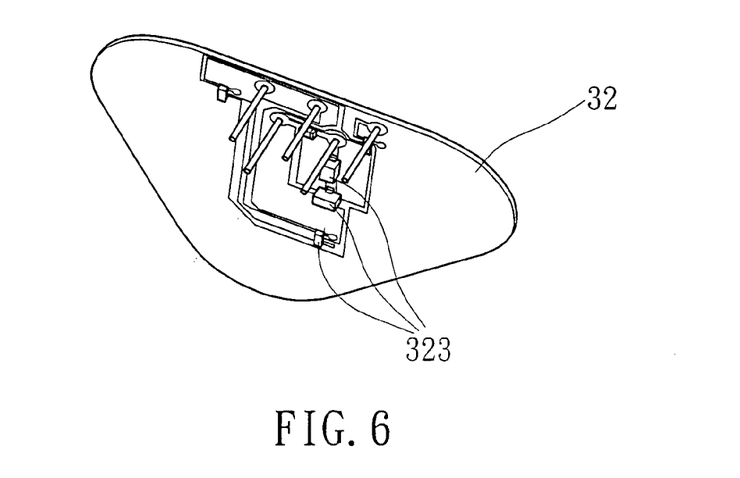
FIG. 6 is a bottom view of the circuit board shown in FIG. 5.
Figure 7:
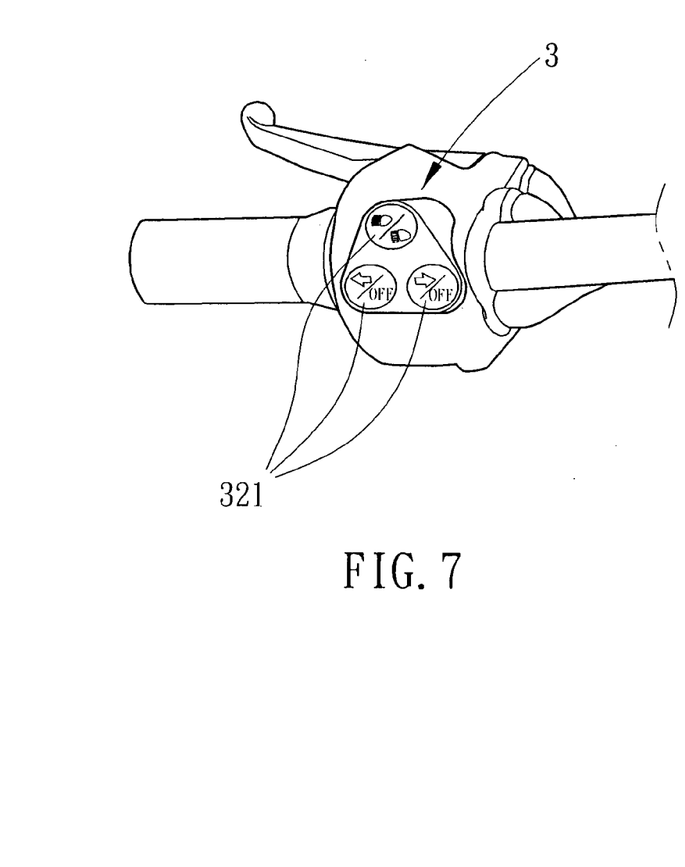
FIG. 7 illustrates the lamp switch unit installed in one handlebar of a motorcycle according to the present invention.

Referring to FIGS. 5~7, a lamp switch unit 3 of the aforesaid lamp switch system is installed in one handlebar of the vehicle (according to this application example, the vehicle is a motorcycle) for controlling the micro-controller unit (MCU) 122 to turn on off the headlamp 127 and/or the left or right turn signal light 128. The lamp switch unit 3 comprises a faceplate 31, a circuit board 32, which is disposed at the bottom side of the faceplate 31 and comprises a plurality of proximity sensor switches 321 respectively dispose in contact with a respective sign (or mark) on the faceplate 31 and a light source 322 for illumination and a plurality of capacitive proximity sensors 323 respectively electrically connected to the proximity sensor switches 321, a transparent top cover 34 housing the faceplate 31 and the circuit board 32, a bottom cover plate 33 covering the bottom side of the transparent top cover 34, and an electric connector 35 electrically connecting the capacitive proximity sensors 323 to the aforesaid micro-controller unit (MCU) 122. The motorcycle rider can touch the sign (or mark) on the faceplate 31 to induce the respective proximity sensor switch 321, causing the associating capacitive proximity censor 323 to output a corresponding control signal to the micro-controller unit (MCU) 122 through the electric connector 35 so the micro-controller unit (MCU) 122 can turn on off the headlamp 127 and/or the left or right turn signal light 128.

Figure 8:
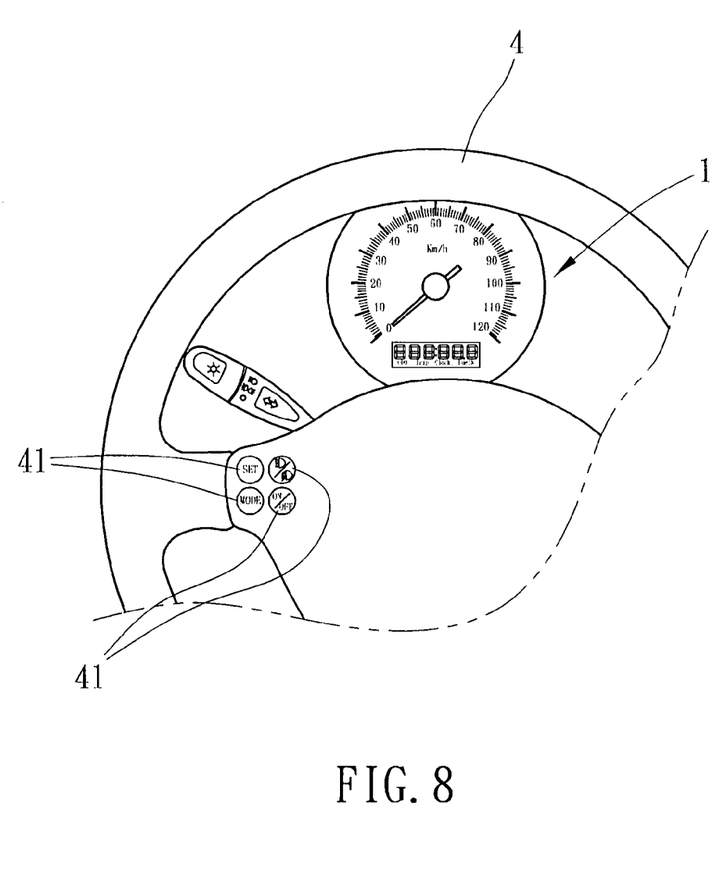
FIG. 8 illustrates the lamp switch unit installed in the steering wheel of a car according to the present invention.
Figure 9:
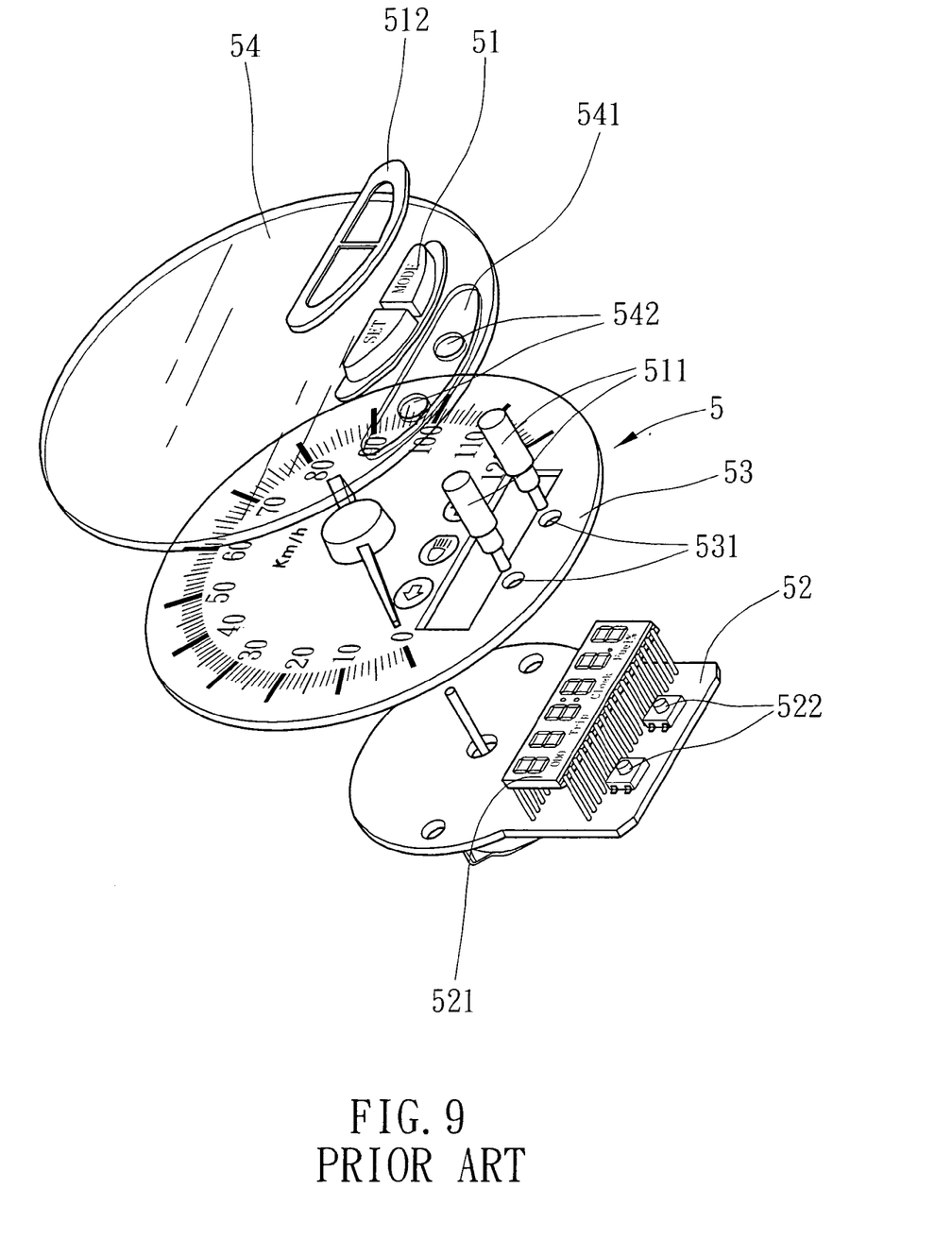
FIG. 9 is an exploded view of an electronic meter for motor vehicle according to the prior art.
Figure 10:
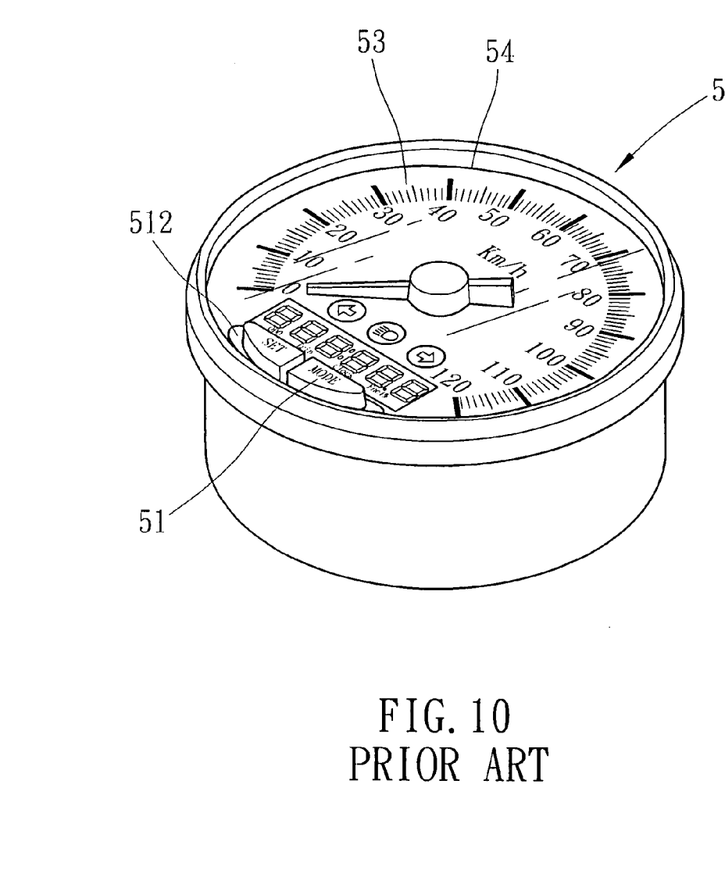
FIG. 10 is an elevational view of the meter according to the prior art.
Figure 11:
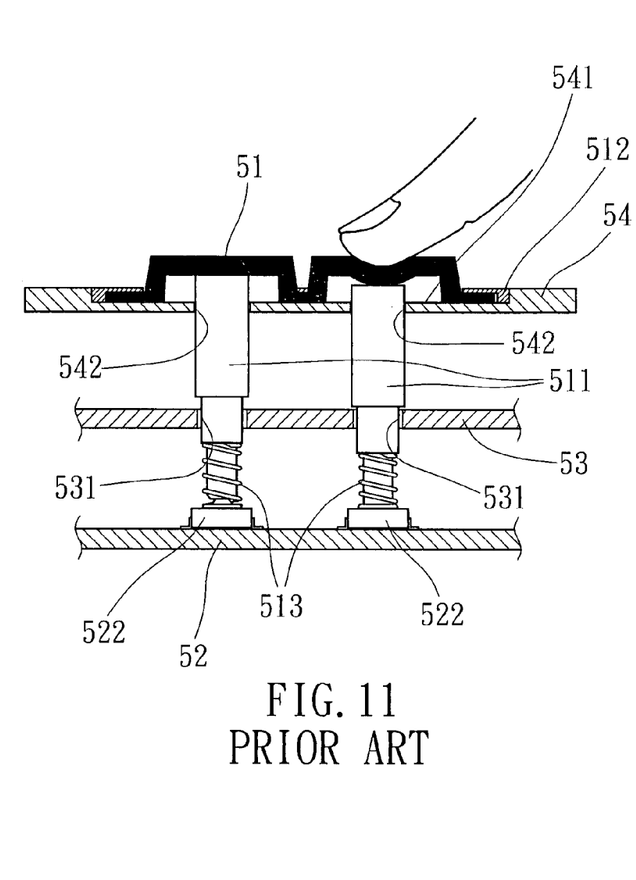
FIG. 11 is a schematic sectional view of a part of the prior art, showing a status of use of the meter.
Figure 12:
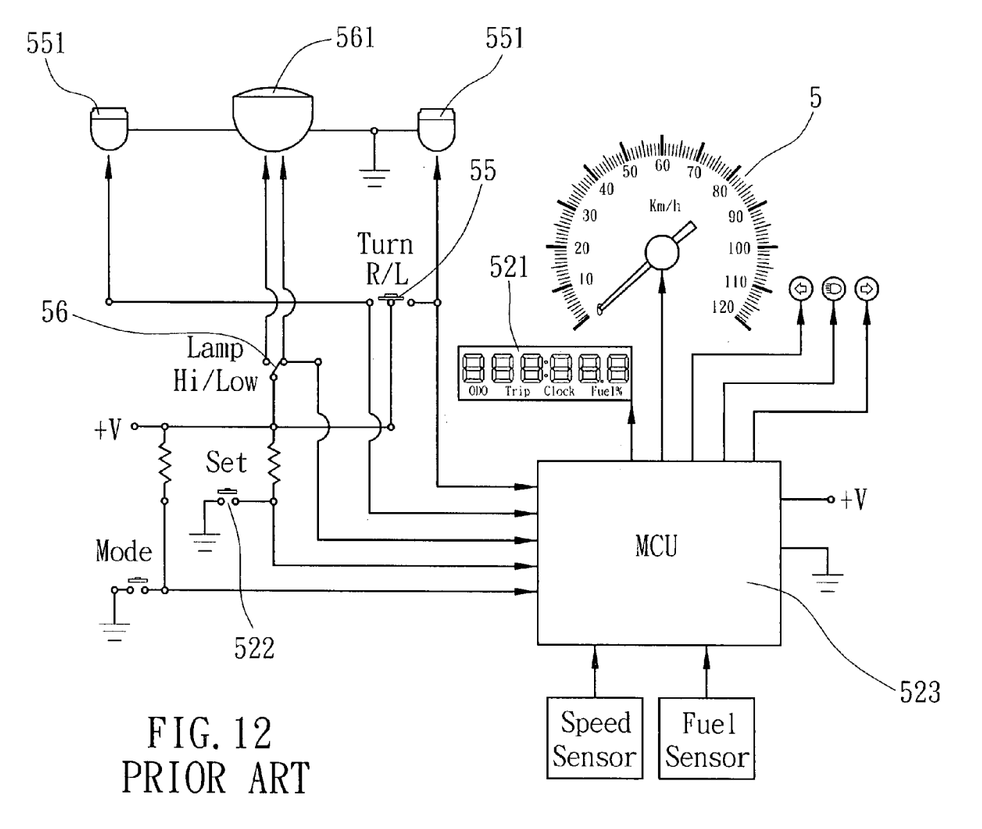
FIG. 12 is a system block diagram of a vehicle meter and lamp switch system according to the prior art.

Referring to FIG. 8, the lamp switch unit of the aforesaid lamp switch system is installed in the steering wheel 4 of the vehicle (according to this application example, the vehicle is a motorcycle) for controlling the micro-controller unit (MCU) 122 to turn on off the headlamp 127 and/or the left or right turn signal light 128. The lamp switch unit according to this application example is substantially similar that shown in FIGS. 5~7. By means of touching the proximity sensor switches 41 of the lamp switch unit, the micro-controller unit (MCU) 122 is driven to turn on/off the headlamp 127 and/or the left or right turn signal light 128.

Referring to FIG. 4 again, a speed sensor 124 and a fuel sensor 125 are respectively electrically connected to the micro-controller unit (MCU) 122 for detecting the speed or fuel oil volume of the vehicle and providing the respective detection result to the micro-controller unit (MCU) 122 so that the micro-controller unit (MCU) 122 can control the meter 1 to indicate the relative data. Further, a fuel injection engine control unit 123 is electrically connected to the micro-controller unit (MCU) 122 and adapted to receive the speed data of the vehicle from the micro-controller unit (MCU) 122 and to control fuel injection subject to the speed of the vehicle.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A proximity sensor switch-controlled meter and lamp switch system installed in a motor vehicle, comprising:
    a meter comprising a faceplate, a transparent glass covering said faceplate, a circuit board provided at a bottom side of said faceplate and having a micro-controller unit (MCU), and an electronic display device mounted in said faceplate and electrically connected to said micro-controller unit (MCU); and
    at least one proximity sensor switch mounted in said faceplate disposed in close proximity to said transparent glass and electrically connected to said micro-controller unit (MCU) of said circuit board, each said proximity sensor switch comprising:
        an induction plate mounted coplanar within said faceplate and spaced from said transparent glass;
        non-deformable conducting means directly fastened to said induction plate and said circuit board with a respective nut and kept in contact with a bottom conductor of said induction plate for outputting a signal to said micro-controller unit (MCU) of said circuit board; and
        a capacitive proximity sensor electrically connected between said non-deformable conducting means and said micro-controller unit (MCU) to detect a change of electric charge at said induction plate and to output a corresponding signal to said micro-controller unit (MCU);
    wherein a display mode of said electronic display device is selectively switched by a user touching said transparent glass to actuate said proximity sensor switch, said induction plate being thereby actuated to output a signal through said non-deformable conducting means to said capacitive proximity sensor coupled to said micro-controller unit (MCU).

2. The proximity sensor switch-controlled meter and lamp switch system as claimed in claim 1, wherein said micro-controller unit (MCU) is electrically connected with a headlamp, a left turn signal light, a right turn signal light, a speed sensor and a fuel sensor of said motor vehicle for receiving signal therefrom and controlling said electronic display device of said meter to display device subject to the signal received.

3. The proximity sensor switch-controlled meter and lamp switch system as claimed in claim 2, wherein said micro-controller unit (MCU) is electrically connected to a fuel injection engine control unit of the motor vehicle to provide the speed data of the motor vehicle obtained through said speed sensor to said fuel injection engine control unit for enabling said fuel injection engine control unit to control fuel injection of the motor vehicle subject to the speed data received.

4. The proximity sensor switch-controlled meter and lamp switch system as claimed in claim 1, wherein said non-deformable conducting means of each said proximity sensor switch is a metal conducting column.

5. The proximity sensor switch-controlled meter and lamp switch system as claimed in claim 1, wherein said non-deformable conducting means of each said proximity sensor switch is a non-metallic conducting member.

6. The proximity sensor switch-controlled meter and lamp switch system as claimed in claim 1, further comprising a lamp switch unit for controlling said micro-controller unit (MCU) to turn on/off a headlamp, a left turn signal light and a right turn signal light of the motor vehicle, said lamp switch unit comprising a faceplate, a circuit board, the circuit board of said lamp switch unit comprising a plurality of proximity sensor switches respectively disposed in contact with a respective sign on the faceplate of said lamp switch unit and a plurality of capacitive proximity sensors respectively electrically connected to the proximity sensor switches of said lamp switch unit, a transparent top cover housing the faceplate and circuit board of said lamp switch unit, a bottom cover plate covering a bottom side of said transparent top cover, and an electric connector electrically connecting the capacitive proximity sensors of said lamp switch unit to said micro-controller unit (MCU), wherein when a finger of a person touches said transparent top cover corresponding to one said proximity sensor switch, the associating capacitive proximity sensor senses an electric charge change and outputs a signal to said micro-controller unit (MCU) for a lamp switching control.

7. The proximity sensor switch-controlled meter and lamp switch system as claimed in claim 1, wherein the circuit board of said lamp switch unit further comprises a light source for giving off light for illumination.

8. The proximity sensor switch-controlled meter and lamp switch system as claimed in claim 1, wherein the motor vehicle in which the proximity sensor switch-controlled meter and lamp switch system is installed is a motorcycle and said lamp switch unit is installed in one handlebar of the motorcycle.

9. The proximity sensor switch-controlled meter and lamp switch system as claimed in claim 1, wherein the motor vehicle in which the proximity sensor switch-controlled meter and lamp switch system is installed is a car; said lamp switch unit is installed in the steering wheel of the car.

\* \* \* \* \*